(12) United States Patent  (10) Patent No.: US 9,368,376 B2
Yu et al.  (45) Date of Patent: Jun. 14, 2016

(54) MECHANICAL DEBONDING METHOD AND SYSTEM

(71) Applicant: National Center for Advanced Packaging Co., Ltd., Wuxi, Jiangsu Province (CN)

(72) Inventors: Daquan Yu, Wuxi (CN); Feng Jiang, Wuxi (CN)

(73) Assignee: National Center for Advanced Packaging Co., Ltd., Wuxi, Jiangsu province (CN)

( * ) Notice: Subject to any disclaimer, the term of this patent is extended or adjusted under 35 U.S.C. 154(b) by 94 days.

(21) Appl. No.: 14/253,589

(22) Filed: Apr. 15, 2014

(65) Prior Publication Data

US 2014/0356988 A1 Dec. 4, 2014

(30) Foreign Application Priority Data

May 29, 2013 (CN) .......................... 2013 1 0211882

(51) Int. Cl.
  *H01L 21/463* (2006.01)
  *H01L 21/68* (2006.01)
  *H01L 21/67* (2006.01)
  *H01L 21/683* (2006.01)

(52) U.S. Cl.
  CPC ........ *H01L 21/67092* (2013.01); *H01L 21/681* (2013.01); *H01L 21/6835* (2013.01); *H01L 2221/6839* (2013.01); *H01L 2221/68318* (2013.01); *H01L 2221/68327* (2013.01); *H01L 2221/68381* (2013.01); *Y10T 83/207* (2015.04); *Y10T 83/2092* (2015.04)

(58) Field of Classification Search
  None
  See application file for complete search history.

(56) References Cited

U.S. PATENT DOCUMENTS

| | | | | |
|---|---|---|---|---|
| 6,376,332 | B1 * | 4/2002 | Yanagita | H01L 21/76251 257/E21.567 |
| 6,609,446 | B1 * | 8/2003 | Ohmi | H01L 21/67092 257/E21.57 |
| 2001/0001975 | A1 * | 5/2001 | Sakaguchi | H01L 21/67092 156/239 |
| 2003/0003687 | A1 * | 1/2003 | Yanagita | H01L 21/76259 438/458 |
| 2004/0137697 | A1 * | 7/2004 | Tomita | H01L 21/76259 438/455 |
| 2011/0308739 | A1 * | 12/2011 | McCutcheon | H01L 21/187 156/766 |
| 2013/0048224 | A1 * | 2/2013 | George | H01L 21/67282 156/752 |
| 2014/0150981 | A1 * | 6/2014 | Itou | B32B 38/1858 156/714 |

* cited by examiner

*Primary Examiner* — Stephen W Smoot
(74) *Attorney, Agent, or Firm* — James Cai; SAC Attorneys LLP

(57) ABSTRACT

A mechanical debonding method and system are provided. A mechanical debonding method, used to debond temporary bonding wafers formed by bonding a device wafer and a carrier wafer by an adhesive, includes: obtaining the height position of the adhesive through a thickness measurement apparatus; moving a cutting apparatus to a position between the device wafer and the carrier wafer based on the height position of the adhesive, then removing the adhesive at the edge of the temporary bonding wafers by the cutting apparatus; removing the carrier wafer from the temporary bonding wafers; cleaning the adhesive left on the surface of the device wafer.

19 Claims, 4 Drawing Sheets

US 9,368,376 B2

MECHANICAL DEBONDING METHOD AND SYSTEM

CROSS-REFERENCE TO RELATED APPLICATION

This application claims priority from CN Patent Application Ser. No. 201310211882.1, filed on May 29, 2013, the entire contents of which are incorporated herein by reference for all purposes.

FIELD OF THE INVENTION

The present invention is related to microelectronics packaging technology, particularly related to a mechanical debonding method and system so as to effectively achieve the interconnection structure of 3D packaging.

BACKGROUND OF THE INVENTION

As electronic products trends to be smaller, multifunctional and environmentally friendly, people attempt to product an electronic system with smaller size, higher integration level, as well as having more comprehensive functions. Therefore, the processing of thin chips and thin device wafers becomes the bottleneck in volume production of ultra-thin products, which brings about a temporary bonding and debonding method.

The temporary bonding and debonding method has following advantages. Firstly, a carrier chip wafer provides mechanical support and protection to a thin device wafer, in which way the back-processing could be performed through equipment from a standard device wafer manufacturer, so that the ultra-thin device wafer is able to be processed at the wafer level. Hence, Equipment from the device wafer manufacturer is able to process the ultra-thin device wafer by a temporary bonding and debonding technique, and there is no need to refit the equipment or employ particular termination effector, fixture or device wafer cassette.

The temporary bonding technology has solved problems as the thin wafer holding issue and fragment production issue during processing. However, there is a high risk of the fragments production when the wafers are separated since multiple uncertainties exist during the separation process. Until now, the medium treatment methods of wafer separation include laser treatment, heat treatment and ZoneBOND etc, yet there are some disadvantages. The laser treatment is limited to the situation that the carrier wafer is made of glass so that the application scene is restricted. Certain warping of temporary bonding wafers appears during heating process, plus heating budget need be considered, the heat treatment is therefore barely applied by manufacturers. On another aspect, the ZoneBOND technology is relatively popular, however, the debonding process has a disadvantage, it requires long pre-brew, which influences productivity and make the volume production impossible.

There are also some other debonding methods in prior art. A technical scheme in a US patent whose publication number is U.S. Pat. No. 8,267,143 B2 decreases the viscosity of an adhesive between a device wafer and a carrier wafer through laser treatment and then separates the adhesive from the wafers by an upward mechanical force. Another technical scheme in a US patent whose publication number is US patent U.S. 2012/0234407A1 mentioned separating the adhesive from the wafers by the relative rotation of the device wafer as well as an upward mechanical force after decreasing the viscosity of the adhesive. However, the mechanical strength of the wafers after thinning is too low to undertake the viscosity during the separation process of the wafers, so that the risk of the fragments during the separation process cannot be effectively solved. Moreover, as the thickness of the wafer after thinning is reducing, there are more difficulties during the debonding process.

Therefore, it is necessary to provide a new mechanical debonding method and system in order to solve those technical problems described above.

SUMMARY OF THE INVENTION

Embodiments of the present invention provide a mechanical debonding method and system to solve problems in the prior art, including excessive time of chemical immersion before debonding processing, low productivity and non-environmentally friendly.

A mechanical debonding method, used to debond temporary bonding wafers formed by bonding a device wafer and a carrier wafer by an adhesive, includes:

obtaining the height position of the adhesive through a thickness measurement apparatus;

moving a cutting apparatus to a position between the device wafer and the carrier wafer based on the height position of the adhesive, then removing the adhesive at the edge of the temporary bonding wafers by the cutting apparatus;

removing the carrier wafer from the temporary bonding wafers;

cleaning the adhesive left on the surface of the device wafer.

A mechanical debonding system, used to debond temporary bonding wafers formed by bonding a device wafer and a carrier wafer by an adhesive, includes:

a thickness measurement apparatus, adapted to measure the height position of the adhesive;

a cutting apparatus, adapted to remove the adhesive at the edge of the temporary bonding wafers;

a controlling apparatus, adapted to control the movement of the cutting apparatus;

a removing apparatus, adapted to remove the carrier wafer from the temporary bonding wafers.

By using the mechanical debonding method and system described above, problems such as excessive time of chemical immersion, low productivity and non-environmentally friendly can be solved, a simple debonding technique with high productivity and environmentally friendly is realized and meanwhile the interconnection structure of 3D packaging is achieved effectively.

Embodiments of the present invention also provide a method for processing a device wafer. In the embodiments, the device wafer is firstly bonded with a carrier wafer to form temporary bonding wafers, and then the grinding-process is applied on the device wafer, after that the debonding method provided in the present invention is applied to the temporary bonding wafers to separate the device wafer processed from the carrier wafer.

By using the method and system for process a device wafer in the embodiments of the present invention, the ZoneBOND technology is adapted to bond the device wafer and the carrier wafer through the temporary adhesive, and the temporary adhesive at the outer ring of the temporary bonding wafers is cut and separated, then the carrier wafer is removed, so as to achieving the temporary bonding and debonding.

BRIEF DESCRIPTION OF THE DRAWINGS

To give a further description of the embodiments in the present invention or the prior art, the appended drawings used to describe the embodiments and the prior art will be introduced as follows. Obviously, the appended drawings described here are only used to explain some embodiments of the present invention. Those skilled in the art can understand that other appended drawings may be obtained according to these appended drawings in the present article without creative work.

DETAILED DESCRIPTION OF THE INVENTION

Figure 1:
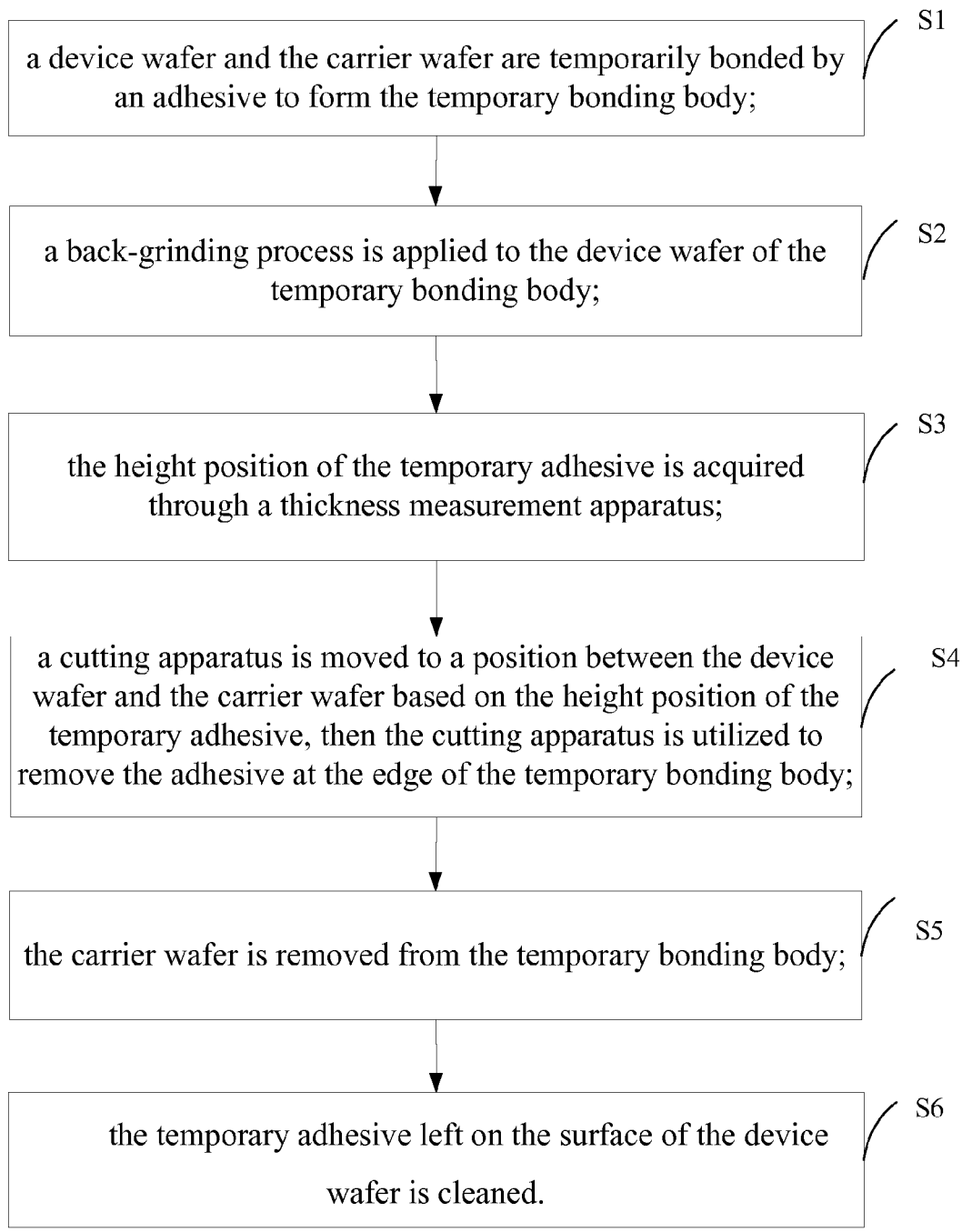
FIG. 1 illustrates the flow chart of a mechanical debonding method in accordance to an embodiment of the present invention.

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be through and complete, and will fully convey the scope of the invention to those skilled in the art. Among other things, the present invention may be embodied as systems, methods or devices. The following detailed description should not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on". The term "coupled" implies that the elements may be directly connected together or may be coupled through one or more intervening elements. Further reference may be made to an embodiment where a component is implemented and multiple like or identical components are implemented.

While the embodiments make reference to certain events this is not intended to be a limitation of the embodiments of the present invention and such is equally applicable to any event where goods or services are offered to a consumer.

Further, the order of the steps in the present embodiment is exemplary and is not intended to be a limitation on the embodiments of the present invention. It is contemplated that the present invention includes the process being practiced in other orders and/or with intermediary steps and/or processes.

Embodiments of the present invention disclose a mechanical debonding method and system.

After a device wafer and a carrier wafer temporarily bonded, the thickness of the carrier wafer is measured firstly and then temporary bonding adhesive at the outer ring of the device wafer and used for bonding is cut, and finally the carrier wafer is stripped by a fixture to debond the device wafer and carrier wafer. In this way, problems of the debonding method of the thin device wafer in the prior art, such as excessive time of chemical immersion, low productivity and non-environmentally friendly can be solved, and meanwhile the interconnection structure of 3D packaging is achieved effectively.

FIG. 1 illustrates the flow chart of a mechanical debonding method in an embodiment of the present invention. As shown in FIG. 1, a mechanical debonding method includes following steps:

Step 1: a device wafer and the carrier wafer are temporarily bonded by an adhesive to form the temporary bonding wafers;

Step 2: a back-grinding process is applied to the device wafer of the temporary bonding wafers;

Step 3: the height position of the temporary adhesive is acquired through a thickness measurement apparatus;

Step 4: a cutting apparatus is moved to a position between the device wafer and the carrier wafer based on the height position of the temporary adhesive, then the cutting apparatus is utilized to remove the adhesive at the edge of the temporary bonding wafers;

Step 5: the carrier wafer is removed from the temporary bonding wafers;

Step 6: the temporary adhesive left on the surface of the device wafer is cleaned.

Those skilled in the art can understand that, strictly spoken, the steps 1 to 6 are steps for processing a device wafer, which include bonding, grinding and debonding. In another word, steps 1 and 2 are not a part of debonding process, which are steps before debonding process.

In an embodiment of the present invention, a mechanical debonding system is disclosed and the system includes:

a thickness measurement apparatus, adapted to measure the height position of a temporary adhesive;

a cutting apparatus, adapted to remove the adhesive at the edge of temporary bonding wafers;

a holding apparatus, adapted to clamp the cutting apparatus;

a controlling apparatus, adapted to control 3D movement of the cutting apparatus;

a removing apparatus, adapted to remove a carrier wafer from the temporary bonding wafers.

In another embodiment, a method for processing a device wafer in the present invention includes following steps:

S1: a temporary adhesive is applied to bond a device wafer and a carrier wafer to form temporary bonding wafers.

The temporary adhesive is applied to bond the device wafer and the carrier wafer according to a ZoneBOND bonding technology. The adhesive force of the temporary adhesive at the edge of the temporary bonding wafers is larger than that in the remaining central zone.

The ZoneBOND technology provides a breakthrough method of temporary wafer bonding as well as thin wafer processing, and overcomes the processing problems brought by the thin wafer. Silicon, glass and other carriers are accepted in the ZoneBOND technology.

In order to realize grinding and back-processing under high temperature, as well as separating the carriers under low external force the carrier wafer are divided into two regions, and the adhesive force in the periphery edge region is larger than that in the central zone. Therefore, after the temporary adhesive removed, only low separation force is needed to separate the carriers. Preferably, the edge zone in an embodiment refers to a zone within 2 mm from the edge of the device wafer or the carrier wafer. In other embodiments, the region of the edge zone may properly increase or decrease according to different wafers.

In an embodiment, the temporary adhesive is molten polymer material (such as HT series adhesive etc.) that reaches a specified temperature. The material of the carrier wafer may be silicon or glass.

Step 2: the back-processing is applied to the device wafer of the temporary bonding wafers.

The back-processing includes: a thinning process, metal interconnection process and micro bump producing, of the device wafer.

In an embodiment, there may also include a front-processing of the device wafer before Step 1, which includes the produce of TSV, metal interconnection and micro bump.

Firstly, a TSV, metal interconnection, micro bump are produced on the front of the device wafer;

Then Step 1 is carried out, specifically, a temporary adhesive is adapted to bond the device wafer and the carrier wafer, and the device wafer of the temporary bonding wafers is thinned through grinding. The thickness of the device wafer after thinning process is 10~300 µm;

After the thinning process, the etching process is performed on the other surface of the device wafer to expose the TSV, and then the metal interconnection and the micro bump are produced.

Step 3: the height position of the temporary adhesive is acquired through a thickness measurement apparatus.

The thickness measurement apparatus is adapted to measure the height position of the temporary adhesive and further give feedbacks of the measurement information to a cutting apparatus. The thickness measurement could be conducted through contacting or non-contacting methods, for instance, through infrared measurement.

Preferably, the upper surface of the carrier wafer is defined as the base plate, and the top position of the temporary adhesive could be obtained by measuring the thickness of the carrier wafer. In other embodiments, another position also may be defined as the base plate. Additionally, measuring the thickness of the carrier wafer is not necessary, as long as the height position of the temporary adhesive is acquired.

Step 4: the cutting apparatus is moved to a position between the device wafer and the carrier wafer based on the height position of the temporary adhesive, then the cutting apparatus is utilized to remove the adhesive at the edge of the temporary bonding wafers.

The cutting apparatus includes a cutting part and a holding part connecting with the cutting part. A holding apparatus is adapted to hold the holding part of the cutting apparatus. In an embodiment, the cutting part is vertical to the holding part, while the cutting part has a tip, which is at the end far from the holding apparatus. The cutting part is parallel to the device wafer and the carrier wafer during the cutting process. In an embodiment, the cutting part may be set as a cylinder and the cutting part tip may be as a cone. The diameters of both the cylinder and the cone are smaller than 100 µm. In other embodiments, the cutting part may be set as other shapes, such as cuboid, flat, etc, as long as with the cutting tip is retained.

The carrier wafer is above the device wafer during the cutting. The feedback of the height position of the temporary adhesive which has been measured from previous steps is transferred to the cutting apparatus; the controlling apparatus controls the 3D movement of the cutting apparatus to make the cutting part of the cutting apparatus be positioned at the temporary adhesive of the temporary bonding wafers.

The cutting apparatus further includes a heating unit adapted to heat the cutting part. Since the temporary adhesive is made from polymer that melts at a certain temperature, the cutting part is heated until the temperature is equal or larger than the melting temperature of the temporary adhesive and then the temporary adhesive at the outer ring of the temporary bonding wafers used for bonding can be cut and separate by the cutting part of the cutting apparatus.

In another embodiment of the present invention, the cutting apparatus may be a stretched diamond line. The diamond line is stretched by the holding apparatus and then the controlling apparatus controls the 3D movement of the diamond line to get close to the temporary bonding wafers. The temporary adhesive is cut by rotating the temporary bonding wafers or the whole cutting apparatus.

Furthermore, the cutting apparatus may also further include a heating unit for heating the diamond line, which makes it more convenient to cut and separate the temporary adhesive.

Step 5: the carrier wafer is removed from the temporary bonding wafers.

By using the ZoneBOND bonding technology, the adhesive force of the temporary adhesive at the edge is larger than that in the remaining central zone. Since the temporary adhesive at the outer ring of the temporary bonding wafers has been cut and separated by the cutting apparatus in Step 4, the carrier wafer and the device wafer merely bond at the central zone and the adhesive force at the central zone is weak. Therefore, the carrier wafer could be removed from the temporary bonding wafers by a removing apparatus. The removing apparatus could be conducted by vacuum sucking or hold-and-take.

Step 6: the temporary adhesive left on the surface of the device wafer is cleaned.

The temporary adhesive remained on the surface of the device wafer is required to be removed. Wet dissolution method or plasma removal method may be chosen according to different temporary adhesive. Normally the Remover chemical liquid is recommended while the adhesive in HT series is applied.

FIG. 2 illustrates a specific process of processing a device wafer in an embodiment of the present invention. The method may include following steps.

1. a device wafer 10 is a silicon chip with a thickness of 700 µm (the front-processing has been finished), and a carrier wafer 20 is a bare silicon chip with a thickness of 700 µm.

Figure 2A:
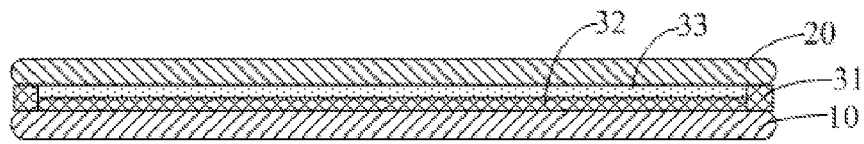
FIGS. 2a-2g illustrates a specific process of processing a device wafer in an embodiment of the present invention.

2. The device wafer 10 and the carrier wafer 20 are temporarily bonded by using a temporary adhesive in HT series according to the ZoneBOND technology. The structure of the temporary bonding wafers after bonding is as shown in FIG. 2a.

The edge of the region between the device wafer 10 and the carrier wafer 20 is bonded by an edge temporary adhesive 31, while the central zone of the region is bonded by a central temporary adhesive 32 and an anti-stacking layer 33. In the central zone, the central temporary adhesive 32 bonds with the device wafer 10 underneath and the anti-stacking layer 33 bonds with the upward carrier wafer 20.

3. The back-processing is applied to the device wafer 10 of the temporary bonding wafers. The back-processing includes: a thinning process, a metal interconnection process and a micro bump producing process.

Figure 2B:
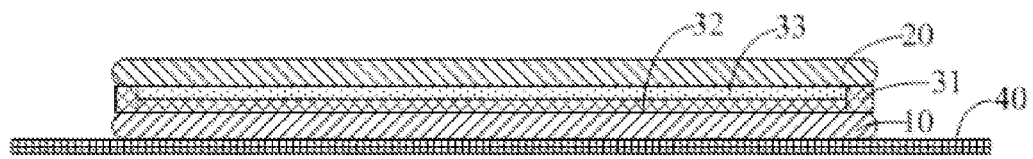

4. The temporary bonding wafers are stuck on a frame (taping) 40 through a taping for sawing, as shown in FIG. 2b.

Figure 2C:
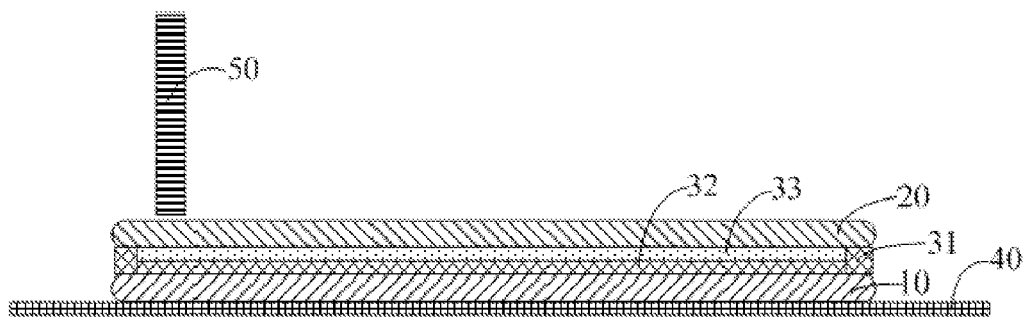

5. The thickness of the carrier wafer 20 is acquired via an infrared measurement apparatus 50, as shown in FIG. 2c.

Figure 2D:
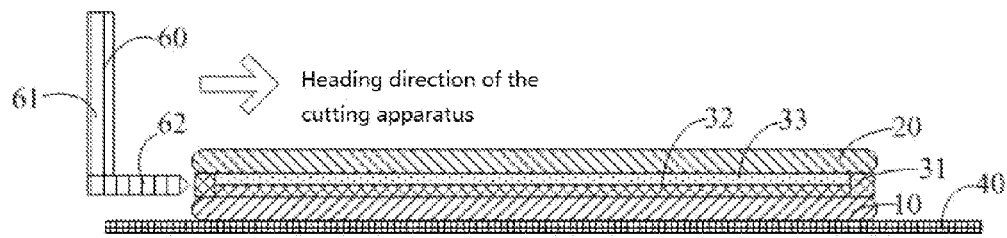

6. The temporary adhesive at the outer ring of the temporary bonding wafers, i.e, the edge temporary adhesive 31, is cut and separated by a cutting apparatus 60, as shown in FIG. 2d.

The cutting apparatus includes a holding part 61 and a cutting part 62, and the two parts are vertically connected. The height of the cutting part 62 is smaller than the thickness of the edge temporary adhesive 31, and normally within 100 μm. On the other hand, the cutting part 62 has a tip, by which it is easier to cut.

The cutting part 62 includes a heating unit, adapted to heat the cutting part till the temperature is equal or larger than the melting temperature of the edge temporary adhesive 31, so that the edge temporary adhesive 31 at the outer ring of the temporary bonding wafers can be cut and separated through the cutting part 62. The cutting part 62 is parallel to both the device wafer and the carrier wafer during the cutting process.

Figure 2E:
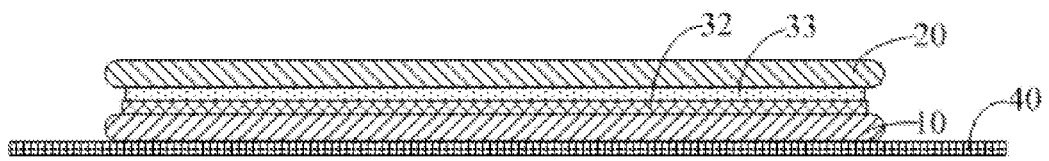

The temporary bonding wafers after cutting are illustrated in FIG. 2e, as shown in FIG. 2e, the edge temporary adhesive 31 in the edge area has been cut and separated.

Figure 2F:
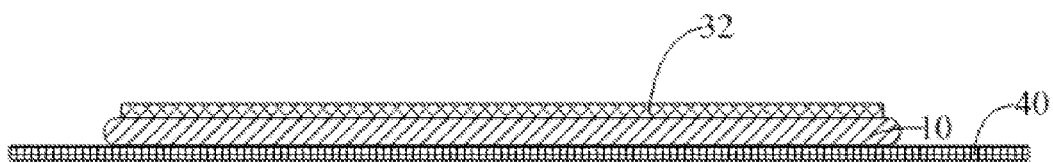

7. The carrier wafer 20 is removed by a removing apparatus (not shown), as shown in FIG. 2f.

Figure 2G:

8. The central temporary adhesive 32 remained on the device wafer 10 is removed. In an embodiment, the central temporary adhesive 32 is removed by a cleaning chemical liquid Remover corresponding to the adhesive in HT series, as shown in FIG. 2g.

The steps described above are only a preferred embodiment. In other embodiments, the thickness of the carrier wafer may be measured through contacting or non-contacting methods. Besides, the removal of the carrier wafer may be performed by a vacuum sucking apparatus.

Figure 3:
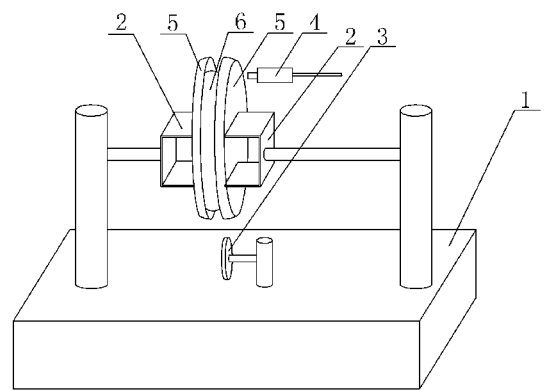
FIG. 3 illustrates a structure of a debonding system in an embodiment of the present invention.

FIG. 3 illustrates a structure of a debonding system in an embodiment of the present invention. As shown in FIG. 3, the system includes a platform 1, a holding part 2 (which may be a vacuum sucking device), a cutting device 3, a measurement apparatus 4. In FIG. 3, the device wafer and carrier wafer 5 are originally bonded by an adhesive 6, and are vertical to the platform. The cutting device 3 locates below the adhesive.

Figure 4:
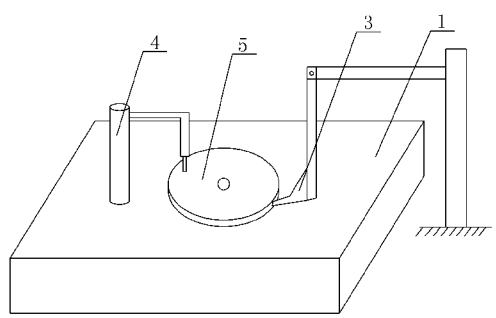
FIG. 4 illustrates a structure of a debonding system in another embodiment of the present invention.

FIG. 4 illustrates a structure of a debonding system in another embodiment of the present invention. As shown in FIG. 4, the system includes a platform 1, a measurement apparatus 4, a holding part on the platform 1 (which is hidden under the wafers and cannot be seen in FIG. 4), used to hold bonded device wafer and carrier wafer 5, a cutting device 3. In FIG. 4, the bonded device wafer and carrier wafer 5 are horizontal to the platform.

The cutting device 3 may be a linear unit, a sheet unit, a rotatable cutting sharp or a plasma with cutting ability.

The cutting device may have an attachment such as one or multi cooling device which can spray water or air.

By using the mechanical debonding method and system in the embodiments of the present invention, the ZoneBOND technology is adapted to bond the device wafer and the carrier wafer through the temporary adhesive, and the temporary adhesive at the outer ring of the temporary bonding wafers is cut and separated, then the carrier wafer is removed, so as to achieving the temporary bonding and debonding.

By using the mechanical debonding method and system described above, problems such as excessive time of chemical immersion, low productivity and non-environmentally friendly can be solved, a simple debonding technique with high productivity and environmentally friendly realized and meanwhile the interconnection structure of 3D packaging is achieved effectively.

For those skilled in the art, they should aware that obviously the present invention has not only the details in the embodiments above, meanwhile, they should be capable of implementing the present invention in other specific forms without deviating the spirit and basic features of the present invention. Therefore, the embodiment is exemplary and non-restrictive under whichever circumstances. The region of the present invention is restricted by the claims attached other than the illustrations above. Considering of which, all the adjustments in accordance with the principle and the scope of claims are considered to be within the protection scope of the present invention. Any signs in the drawings of the claims should not be considered as the restriction to the claims referred.

Moreover, it should be understood that although this literature is described in embodiments, however, not each embodiment has merely one independent technical scheme. This way of description is used barely for clarity. For those skilled in the art, this literature should be considered as an entirety. Technical schemes from each embodiment could be properly combined and form as other embodiments that can be understood by those skilled in the art.

The invention claimed is:

1. A mechanical debonding method, used to debond temporary bonding wafers formed by bonding one device wafer and one carrier wafer by an adhesive, comprising:
   obtaining the height position of the adhesive through a thickness measurement apparatus;
   moving a cutting apparatus, under control of a controlling apparatus, to a position between the device wafer and the carrier wafer based on the height position of the adhesive, then removing the adhesive at the edge of the temporary bonding wafers by the cutting apparatus;
   removing the carrier wafer from the temporary bonding wafers through a removing apparatus;
   cleaning the adhesive left on the surface of the device wafer.

2. The method of claim 1, wherein, the adhesive force of the adhesive in an edge zone of the temporary bonding wafers is larger than that in a remaining central zone of the temporary bonding wafers.

3. The method of claim 2, wherein, the edge zone is the zone within 2 mm from the edge of the device wafer or the carrier wafer.

4. The method of claim 2, wherein, the adhesive comprises an edge temporary adhesive, a central temporary adhesive and an anti-stacking layer, and the edge zone between the device wafer and the carrier wafer is bonded by the edge temporary adhesive, while the remaining central zone is bonded by the central temporary adhesive and the anti-stacking layer; wherein, in the remaining central zone, the central temporary adhesive bonds with the device wafer and the anti-stacking layer bonds with the upward carrier wafer.

5. The method of claim 1, wherein the cutting apparatus includes a cutting part and a holding part connected with the cutting part,
   the method further comprising:
   heating the cutting part of the cutting apparatus.

6. The method of claim 1, wherein, removing the carrier wafer from the temporary bonding wafers comprises:
   removing the carrier wafer from the temporary bonding wafers by vacuum sucking or hold-and-take.

7. The method of claim 1, wherein, cleaning the adhesive left on the surface of the device wafer comprises:
   cleaning the adhesive remained on the carrier wafer and device wafer surface by wet dissolution or plasma removal.

8. A mechanical debonding system, used to debond temporary bonding wafers formed by bonding one device wafer and one carrier wafer by an adhesive, wherein, the system comprises:
- a thickness measurement apparatus, adapted to measure the height position of the adhesive;
- a cutting apparatus, adapted to remove the adhesive at the edge of the temporary bonding wafers;
- a controlling apparatus, adapted to control the movement of the cutting apparatus;
- a removing apparatus, adapted to remove the carrier wafer from the temporary bonding wafers.

9. The system of claim 8, further comprising:
a heating unit, adapted to heat the cutting apparatus.

10. The system of claim 8, wherein, the cutting apparatus comprises a cutting part and a holding part, and the two parts are connected with each other;
and the system further comprises
a holding apparatus, adapted to clamp the cutting part of the cutting apparatus.

11. The system of claim 10, wherein, the cutting part has a tip, which is at the end far from the holding apparatus.

12. The system of claim 8, wherein, the cutting apparatus is a stretched diamond line.

13. The system of claim 8, wherein, the thickness measurement apparatus is an infrared measurement apparatus.

14. The system of claim 8, wherein, the removing apparatus is a vacuum sucking apparatus or a hold-and-take apparatus.

15. The system of claim 8, further comprising:
a cleaning apparatus, adapted to remove the adhesive by a cleaning chemical liquid.

16. A method for processing a device wafer, comprising:
- bonding one device wafer and one carrier wafer by an adhesive to form temporary bonding wafers;
- applying back-processing to the device wafer of the temporary bonding wafers;
- obtaining the height position of the adhesive through a thickness measurement apparatus;
- moving a cutting apparatus, under control of a controlling apparatus, to a position between the device wafer and the carrier wafer based on the height position of the adhesive, then removing the adhesive at the edge of the temporary bonding wafers by the cutting apparatus;
- removing the carrier wafer from the temporary bonding wafers through a removing apparatus;
- cleaning an adhesive left on the surface of the device wafer.

17. The method of claim 16, wherein the cutting apparatus includes a cutting part and a holding part connected with the cutting part,
the method further comprising:
heating the cutting part of the cutting apparatus.

18. The method of claim 16, wherein, removing the carrier wafer from the temporary bonding wafers comprises:
removing the carrier wafer from the temporary bonding wafers by vacuum sucking or hold-and-take.

19. The method of claim 16, wherein, the back-processing comprises: a thinning process, metal interconnection process and micro bump producing, of the device wafer.

* * * * *